(12) United States Patent
Konno et al.

(10) Patent No.: US 9,247,652 B2
(45) Date of Patent: Jan. 26, 2016

(54) ADHESIVE COMPOSITION, ELECTRONIC-COMPONENT-MOUNTED SUBSTRATE AND SEMICONDUCTOR DEVICE USING THE ADHESIVE COMPOSITION

(75) Inventors: Kaoru Konno, Tsukuba (JP); Hiroki Hayashi, Tsukuba (JP); Takashi Kawamori, Tsukuba (JP)

(73) Assignee: HITACHI CHEMICAL COMPANY, LTD., Tokyo (JP)

( * ) Notice: Subject to any disclaimer, the term of this patent is extended or adjusted under 35 U.S.C. 154(b) by 785 days.

(21) Appl. No.: 12/680,923

(22) PCT Filed: Oct. 2, 2008

(86) PCT No.: PCT/JP2008/067911

§ 371 (c)(1),
(2), (4) Date: Mar. 31, 2010

(87) PCT Pub. No.: WO2009/044801

PCT Pub. Date: Apr. 9, 2009

(65) Prior Publication Data

US 2010/0221559 A1 Sep. 2, 2010

(30) Foreign Application Priority Data

Oct. 3, 2007 (JP) .................. 2007-259739

(51) Int. Cl.
*B32B 15/02* (2006.01)
*H01B 1/02* (2006.01)
(Continued)

(52) U.S. Cl.
CPC .............. *H05K 3/321* (2013.01); *B22F 1/0059* (2013.01); *B23K 35/025* (2013.01);
(Continued)

(58) Field of Classification Search
None
See application file for complete search history.

(56) References Cited

U.S. PATENT DOCUMENTS 4,528,333 A * 7/1985 Chang et al. .................. 525/398
5,439,164 A 8/1995 Hasegawa et al.
(Continued)

FOREIGN PATENT DOCUMENTS

CN 1374168 10/2002
CN 1926929 3/2007
(Continued)

OTHER PUBLICATIONS

Official Action dated Oct. 17, 2011, for Application No. 10-2010-7006925; 4 Pages; Korean Patent Office; Republic of Korea.
(Continued)

*Primary Examiner* — Monique Jackson
(74) *Attorney, Agent, or Firm* — Fitch, Even, Tabin and Flannery LLP

(57) ABSTRACT

There are provided are an adhesive composition that keeps storage stability and further gives a cured product wherein metallic bonds are formed in the state that the cured product wets its components and is satisfactorily spread between the components (or parts), thereby turning excellent in adhesive property, electroconductivity, and reliability for mounting such as TCT resistance or high-temperature standing resistance; an electronic-component-mounted substrate using the same; and a semiconductor device. The adhesive composition comprises electroconductive particles (A) and a binder component (B), wherein the electroconductive particles (A) include a metal (a1) having a melting point equal to or higher than the reflow temperature and containing no lead, and a metal (a2) having a melting point lower than the reflow temperature and containing no lead, and the binder component (B) includes a thermosetting resin composition (b1) and an aliphatic dihydroxycarboxylic acid (b2).

9 Claims, 2 Drawing Sheets

(51) Int. Cl.
| | |
|---|---|
| H01B 1/22 | (2006.01) |
| H05K 3/32 | (2006.01) |
| B22F 1/00 | (2006.01) |
| B23K 35/02 | (2006.01) |
| B23K 35/26 | (2006.01) |
| B23K 35/30 | (2006.01) |
| B23K 35/36 | (2006.01) |
| B23K 35/362 | (2006.01) |
| B23K 35/365 | (2006.01) |
| C09J 9/02 | (2006.01) |
| C09J 11/04 | (2006.01) |
| H01L 23/00 | (2006.01) |
| C08K 3/00 | (2006.01) |
| C08K 3/08 | (2006.01) |
| H05K 1/14 | (2006.01) |

(52) U.S. Cl.
CPC .......... *B23K 35/0244* (2013.01); *B23K 35/262* (2013.01); *B23K 35/264* (2013.01); *B23K 35/302* (2013.01); *B23K 35/362* (2013.01); *B23K 35/365* (2013.01); *B23K 35/3613* (2013.01); *B23K 35/3618* (2013.01); *C09J 9/02* (2013.01); *C09J 11/04* (2013.01); *H01B 1/22* (2013.01); *H01L 24/12* (2013.01); *B22F 2001/0066* (2013.01); *C08K 3/0066* (2013.01); *C08K 3/08* (2013.01); *H01L 24/16* (2013.01); *H01L 2224/13099* (2013.01); *H01L 2224/16* (2013.01); *H01L 2924/0103* (2013.01); *H01L 2924/014* (2013.01); *H01L 2924/01005* (2013.01); *H01L 2924/01006* (2013.01); *H01L 2924/01009* (2013.01); *H01L 2924/01012* (2013.01); *H01L 2924/01013* (2013.01); *H01L 2924/01015* (2013.01); *H01L 2924/01019* (2013.01); *H01L 2924/01022* (2013.01); *H01L 2924/01027* (2013.01); *H01L 2924/01029* (2013.01); *H01L 2924/01033* (2013.01); *H01L 2924/01046* (2013.01); *H01L 2924/01047* (2013.01); *H01L 2924/01057* (2013.01); *H01L 2924/01074* (2013.01); *H01L 2924/01078* (2013.01); *H01L 2924/01079* (2013.01); *H01L 2924/01082* (2013.01); *H01L 2924/15747* (2013.01); *H01L 2924/19043* (2013.01); *H05K 1/141* (2013.01); *H05K 2201/0272* (2013.01); *H05K 2203/0425* (2013.01); *Y10T 428/31511* (2015.04); *Y10T 428/31678* (2015.04)

(56) References Cited

U.S. PATENT DOCUMENTS

| | | | |
|---|---|---|---|
| 7,422,707 B2 * | 9/2008 | Zhuo | 252/500 |
| 7,785,500 B2 * | 8/2010 | Yamaguchi et al. | 252/514 |
| 7,966,721 B2 | 6/2011 | Wada et al. | |
| 2003/0051770 A1 | 3/2003 | Nishina et al. | |
| 2009/0114885 A1 | 5/2009 | Yamaguchi et al. | |

FOREIGN PATENT DOCUMENTS

| | | |
|---|---|---|
| CN | 19269298 | 3/2007 |
| JP | 06-262375 | 9/1994 |
| JP | 06-312291 | 11/1994 |
| JP | 2001-170797 | 6/2001 |
| JP | 2002-161259 | 6/2002 |
| JP | 2002-239785 | 8/2002 |
| JP | 2004-160508 | 6/2004 |
| JP | 3730209 | 10/2005 |
| JP | 2008150597 A * | 7/2008 |
| WO | WO 2007/052661 | 5/2007 |

OTHER PUBLICATIONS

International Preliminary Report on Patentability for International Application No. PCT/JP2008/067911, Dated May 4, 2010.
Communication mailed May 18, 2012, in connection with Taiwanese Patent Application No. 10120482550, 6 pages; Taiwanese Patent Office, Taiwan.
Communication mailed May 19, 2012, in connection with Korean Patent Application No. 10-2010-7006925, 3 pages; Korean Patent Office, Korea.
Extended European Search Report dated Oct. 17, 2011, for Application No. 08835881.7; 6 Pages; European Patent Office; Munich, Germany.
Communication mailed Jul. 31, 2012, in connection with Japanese Patent Application No. 2009-536080, 2 pages; Japanese Patent Office, Japan.
Communication mailed Feb. 22, 2013, in connection with Taiwanese Patent Application No. 097138262, 5 pages; Taiwanese Intellectual Property Office, Taiwan.
Machine translation of JP 2004-160508.
Communication mailed Sep. 5, 2013, in connection with Korean Patent Application No. 10-2012-7024494, 5 pages; Korean Patent Office, Korea.

* cited by examiner

ADHESIVE COMPOSITION, ELECTRONIC-COMPONENT-MOUNTED SUBSTRATE AND SEMICONDUCTOR DEVICE USING THE ADHESIVE COMPOSITION

TECHNICAL FIELD

The present invention relates to an adhesive composition used as an electronic component, a circuit wiring material, an electrode material, an electroconductive bonding material, an electroconductive adhesive or a die bonding material; and an electronic-component-mounted substrate and a semiconductor device using the composition.

BACKGROUND ART

In order to mount electronic components onto a circuit board or the like, well-known is a bonding method using solder which contains lead. In recent years, however, knowledge about environmental problems has been increasing; thus, attention has been paid to lead-free solders or adhesive compositions, which contain, no lead, instead of solder.

However, SnAgCu solder, which is mainly used as a lead-free solder, has a problem that the temperature for connection therewith is as high as 260° C. so that the solder is not usable for some electric components high in thermal sensitivity. As a lead-free solder for lower temperature, Sn—Bi solder, the melting point of which is 138° C., is known. However, the solder has a problem that in an article used in a high-temperature environment, the solder is allowed to stand still at high temperature, whereby the composition of the solder is varied so that the solder turns brittle.

In order to overcome these problems, there is suggested a thermosetting type electroconductive adhesive made into a paste form wherein a filler such as silver powder is dispersed in a thermosetting resin (Japanese Patent Application Laid-Open No. 2002-161259). About the thermosetting type electroconductive adhesive, the thermosetting resin is used as a binder component, thereby making it possible to restrain a fall in the strength at high temperature. However, a mechanism for expressing the electroconductivity is based on contact between the metal particles; therefore, in order to ensure a good electroconductivity, it is necessary to increase the amount of the filled electroconductive particles. As a result, there remains a problem that a fall in the adhesive force is caused by a decrease in the amount of the binder component.

Thus, suggested is an electroconductive adhesive wherein a flux and a metal meltable at low temperature, such as lead-free solder, are filled into a thermosetting resin, thereby making the adhesive property and the electroconductivity compatible with each other (see Japanese Patent No. 3730209, and JP-A No. 2001-170797). The solder-containing electroconductive adhesive is excellent in viewpoints that electroconductivity is ensured by metallic bonds of the solder, that a flux-washing step is eliminated by the flux meltability of the thermosetting resin and the heat resistance thereof, and that adhesive property is ensured. However, a halogen-containing flux has a problem of a load onto the environment or the induction of migration, and other problems. A bifunctional carboxylic acid having no hydroxyl group has a problem that the addition amount for forming metallic bonds turns remarkably large so that the storage stability declines or the adhesive property lowers, or other problems.

An object of the invention is to provide an adhesive composition that keeps storage stability and further gives a cured product wherein metallic bonds are formed in the state that the cured product wets its components (or parts) and is satisfactorily spread between the components, thereby turning excellent in adhesive property, electroconductivity, and reliability for mounting such as TCT resistance or high-temperature standing resistance. Another object of the invention is to provide an electronic-component-mounted substrate or semiconductor device having a good reliability.

DISCLOSURE OF THE INVENTION

The invention relates to (1) an adhesive composition, comprising electroconductive particles (A) and a binder component (B), wherein the electroconductive particles (A) include a metal (a1) having a melting point equal to or higher than the reflow temperature and containing no lead, and a metal (a2) having a melting point lower than the reflow temperature and containing no lead, and the binder component (B) includes a thermosetting resin composition (b1) and an aliphatic dihydroxycarboxylic acid (b2).

The invention also relates to (2) the adhesive composition according to item (1), wherein the reflow temperature is the temperature for mounting with SnAgCu cream solder.

The invention also relates to (3) the adhesive composition according to item (1) or (2), wherein the reflow temperature is 260° C.

The invention also relates to (4) the adhesive composition according to any one of items (1) to (3), wherein the aliphatic dihydroxycarboxylic acid (b2) is a dihydroxyalkanoic acid.

The invention also relates to (5) the adhesive composition according to any one of items (1) to (4), wherein the aliphatic dihydroxycarboxylic acid (b2) is an aliphatic dihydroxycarboxylic acid represented by the following general formula (1):

[formula 1]

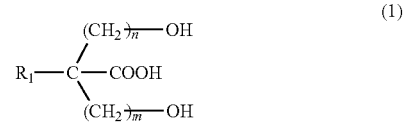

$$R_1-\underset{(CH_2)_{\overline{n}}-OH}{\overset{(CH_2)_{\overline{m}}-OH}{C}}-COOH \quad (1)$$

wherein $R_1$ is an alkyl group which may have a substituent, and n and m are each an integer of 0 to 5.

The invention also relates to (6) the adhesive composition according to any one of items (1) to (5), wherein the content of the aliphatic dihydroxycarboxylic acid (b2) is 0.1 part or more by weight and 20 parts or less by weight for 100 parts by weight of the metal (a2) having the melting point lower than the reflow temperature and containing no lead.

The invention also relates to (7) an electronic-component-mounted substrate having a structure wherein a substrate and an electronic component are bonded to each other through an adhesive composition as recited in any one of items (1) to (6).

The invention also relates to (8) a semiconductor device having a structure wherein a semiconductor element and a semiconductor-element-mounting supporting member are bonded to each other through an adhesive composition as recited in any one of items (1) to (6).

The invention makes it possible to provide an adhesive composition that keeps storage stability and further gives a cured product wherein metallic bonds are formed in the state that the cured product wets its components and is satisfactorily spread between the components, thereby turning excellent in adhesive property, electroconductivity, and reliability for mounting such as TCT resistance or high-temperature standing resistance; and an electronic-component-mounted substrate and a semiconductor device each using the composition.

BEST MODE FOR CARRYING OUT THE INVENTION

Figure 1:
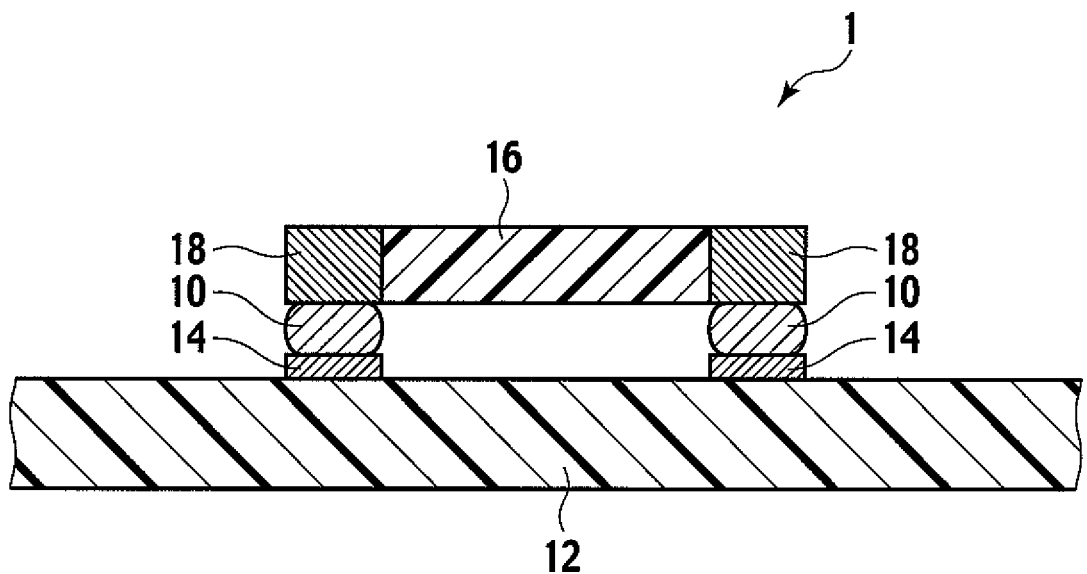
FIG. 1 is a schematic sectional view illustrating a preferred embodiment of the electronic-component-mounted substrate of the invention.

The adhesive composition of the invention is adhesive composition which comprises electroconductive particles (A) and a binder component (B) wherein the electroconductive particles (A) contain a metal (a1) having a melting point equal to or higher than the reflow temperature and containing no lead, and a metal (a2) having a melting point lower than the reflow temperature and containing no lead, and the binder component (B) contains a thermosetting resin composition (b1) and an aliphatic dihydroxycarboxylic acid (b2).

Hereinafter, each of the components contained in the adhesive composition of the invention will be described.

Electroconductive Particles (A)

The electroconductive particles (A) used in the invention contain both of a metal (a1) having a melting point equal to or higher than the reflow temperature and containing no lead, and a metal (a2) having a melting point lower than the reflow temperature and containing no lead.

The reflow temperature is, for example, the temperature for mounting with SnAgCu cream solder, which is 260° C.

The metal (a1) having a melting point equal to or higher than the reflow temperature and containing no lead is, for example, a metal selected from Pt, Au, Ag, Cu, Ni, Pd, Al and others, or an alloy composed of two or more metals selected therefrom. More specific examples thereof include Au powder, Ag powder, Cu powder, and Ag-plated Cu powder. As a commercially available product thereof, a product "MA05K" (trade name) manufactured by Hitachi Chemical Co., Ltd. is favorably used.

The metal (a2) having a melting point lower than the reflow temperature and containing no lead is, for example, a metal selected from Sn, Ag, Cu, Bi, In, Zn and others, or an alloy composed of two or more metals selected therefrom. More specific examples thereof include Sn42-Bi58 solder (melting point: 138° C.), and Sn96.5-Ag3-Cu05 solder (melting point: 217° C.).

The content by percentage of the electroconductive particles (A) in the adhesive composition is preferably from 5 to 95% by weight, is more preferably from 10 to 90% by weight from the viewpoint of workability and electroconductivity, and is even more preferably from 15 to 85% by weight from the viewpoint of reliability for mounting. If the content by percentage of the electroconductive particles (A) is less than 5% by weight, the electroconductivity tends to lower. On the other hand, if the content by percentage is more than 95% by weight, the viscosity of the adhesive composition becomes high so that the composition may not be able to keep workability certainly. Alternatively, the amount of the binder component (B) is lower so that the mounting reliability tends to decline.

About the blend ratio between the metal (a1) having a melting point equal to or higher than the reflow temperature and containing no lead and the metal (a2) having a melting point lower than the reflow temperature and containing no lead, the ratio of (a1):(a2) is preferably 90~1% by weight: 10~99% by weight, and is more preferably 70~5% by weight: 30~95% by weight from the viewpoint of electroconductivity, and is even more preferably 60~10% by weight: 40~90% by weight from the viewpoint of mounting reliability. If the blend percentage of the metal (a2) having a melting point lower than the reflow temperature and containing no lead is less than 10% by weight or more than 99% by weight, the mounting reliability tends to lower.

In the case of, for example, the metal (a1), the form that the electroconductive particles (A) are contained in the adhesive composition is as follows: particles made only of the metal (a1); mixed particles wherein particles made only of the metal (a1) are mixed with a filling material; and coated particles wherein the surface of a filling material is coated with the metal (a1). The same matter is applied to the case of the metal (a2) also. In this case, the combination of the metal (a1) and the metal (a2) may be any combination.

The average particle diameter of the particles made only of the metal (a1) or the metal (a2) is not particularly limited. The diameter is preferably from 0.1 to 100 μm, is more preferably from 1.0 to 50 μm from the viewpoint of printability or workability, and is even more preferably from 5.0 to 30 μm from the viewpoint of storage stability or mounting reliability. If the average particle diameter is less than 0.1 μm, the viscosity of the adhesive composition becomes high so that the workability may not be able to be ensured. Alternatively, in order to ensure the meltability of the metal, the adhesive composition comes to need a large amount of the aliphatic dihydroxycarboxylic acid (b2) so that the storage stability or the adhesive force tends to lower. If the average particle diameter is more than 100 μm, the printability or the connection reliability tends to decline. The average particle diameter is the 50% by volume particle diameter, and may be obtained by measurement using a Mastersizer laser scattering particle size distribution analyzer (manufactured by Malvern Instruments Ltd.).

The filling material mixed with the metal(s) or the filling material coated with the metal(s) may be polymer particles of acrylic rubber, polystyrene or the like; or inorganic particles of diamond, boron nitride, aluminum nitride, alumina or the like.

Binder Component (B)

The binder component (B) used in the invention contains both of a thermosetting resin composition (b1) and an aliphatic dihydroxycarboxylic acid (b2).

In the invention, about the blend ratio between the electroconductive particles (A) and the binder component (B), the ratio by weight of the electroconductive particles (A):the binder component (B), on the basis of solids in the adhesive composition, is preferably from 50:50 to 95:5. From the viewpoint of adhesive property, electroconductivity and workability, the ratio of the electroconductive particles (A):the binder component (B) is more preferably from 70:30 to 90:10. If the percentage of the binder component (B) is more than 50% by weight in connection with the blend ratio, the amount of the electroconductive particles (A) is insufficient so that the electroconductivity tends to deteriorate. If the percentage is less than 5% by weight, the viscosity of the adhesive composition becomes high so that the workability tends to be unable to be ensured, or the adhesive force tends to fall.

In the invention, the binder component (B) means a mixture of a thermosetting resin composition (b1) and an aliphatic dihydroxycarboxylic acid (b2).

The thermosetting resin composition (b1) contains a thermosetting organic polymeric compound or a precursor thereof, and may optionally contain one or more from a reactive diluting agent, a curing agent, a curing promoter for an improvement in curability, a compound having a polymerizable ethylenical carbon-carbon double bond, a radical initiator, a flexibility agent for relieving stress, a diluting agent for an improvement in workability, an adhesive force improver, a wettability improver, an antifoamer, and a reactive diluting agent for a fall in viscosity. The thermosetting resin composition (b1) may contain a component other than the components recited herein.

The thermosetting organic polymeric compound or the precursor thereof is not particularly limited. Examples thereof include epoxy resin, acrylic resin, maleimide resin, cyanate resin and other thermosetting organic polymeric compounds; and precursors thereof. Of these examples, acrylic resin, maleimide resin or epoxy resin is preferred since the resin is excellent in heat resistance and adhesive property and is further capable of being prepared into a liquid form by the use of an appropriate solvent, so as to exhibit an excellent workability. About the thermosetting organic polymeric compound or the precursor thereof, a single species thereof may be used alone, or two or more species thereof may be used in combination.

factured by Tohto Kasei Co., Ltd.), and EOCN-100 (trade name, manufactured by Nippon Kayaku Co., Ltd.); polyfunctional epoxy resins such as EPPN-501 (trade name, manufactured by Nippon Kayaku Co., Ltd.), TACTIX-742 (trade name, manufactured by Dow Chemical Co.), VG-3010 (trade name, manufactured by Mitsui Petrochemical Industries, Ltd.), and 1032S (trade name, manufactured by Yuka-Shell Epoxy Co., Ltd.); epoxy resins having a naphthalene skeleton such as HP-4032 (trade name, manufactured by Dainippon Ink & Chemicals, Inc.); alicyclic epoxy resins such as EHPE-3150 and CEL-3000 (trade names, each manufactured by Daicel Chemical Industries, Ltd.), DME-100 (trade name, manufactured by New Japan Chemical Co., Ltd.), and EX-216L (trade name, manufactured by Nagase Chemicals Ltd.); aliphatic epoxy resins such as W-100 (trade name, manufactured by New Japan Chemical Co., Ltd.; amine type epoxy resins such as ELM-100 (trade name, manufactured by Sumitomo Chemical Co., Ltd., YH-434L (trade name, manufactured by Tohto Kasei Co., Ltd.), TETRAD-X and TETRAC-C (trade names, each manufactured by Mitsubishi Gas Chemical Co., Inc.); resorcin type epoxy resins such as DENACOL EX-201 (trade name, manufactured by Nagase Chemicals Ltd.); neopentyl glycol type epoxy resins such as DENACOL EX-211 (trade name, manufactured by Nagase Chemicals Ltd.); hexane diol glycol type epoxy resins such as DENACOL EX-212 (trade name, manufactured by Nagase Chemicals Ltd.); ethylene/propylene glycol type epoxy resins such as DENACOL EX series (EX's-810, 811, 850, 851, 821, 830, 832, 841 and 861 (trade names, each manufactured by Nagase Chemicals Ltd.); and E-XL-24, and E-XL-3L (trade names, each manufactured by Mitsui Toatsu Chemicals, Inc.), which are each an epoxy resin represented by the following general formula (I):

[formula 2]

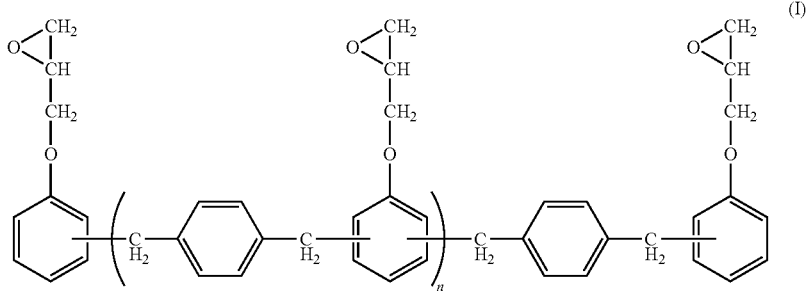

In the general formula (I), n represents an integer of 1 to 5.

Of these resins, trifunctional or higher functional epoxy resins are preferred from the viewpoint of heat resistance and reaction rate. Furthermore, tertiary-amine-containing epoxy resins are more preferred from the viewpoint of adhesive force.

These epoxy resins may be used alone or in combination of two or more thereof.

When epoxy resin is used as the thermosetting organic polymeric compound, it is preferred to use a reactive diluting agent, a curing agent and a curing promoter together.

The above-mentioned epoxy resin is preferably a compound having, in a single molecule thereof, two or more epoxy groups, and is, for example, any epoxy resin derived from bisphenol A, bisphenol F, bisphenol AD or the like, and epichlorohydrin. Specific examples thereof include bisphenol A type epoxy resins such as AER-X8501 (trade name, manufactured by Asahi Kasei Corp.), R-301 (trade name, manufactured by Yuka-Shell Epoxy Co., Ltd.), and YL-980 (trade name, manufactured by Yuka-Shell Epoxy Co., Ltd.); bisphenol F type epoxy resins such as YDF-170 (trade name, manufactured by Tohto Kasei Co., Ltd.); bisphenol AD type epoxy resins such as R-1710 (trade name, manufactured by Mitsui Petrochemical Industries, Ltd.); phenol Novolak type epoxy resins such as N-730S (trade name, manufactured by Dainippon Ink & Chemicals, Inc.), and Quatrex-2010 (trade name, manufactured by Dow Chemical Co.); cresol Novolak type epoxy resins such as YDCN-702S (trade name, manu- The reactive diluting agent may be an epoxy compound having, in a single molecule thereof, only one epoxy group. The agent is used as far as properties of the adhesive composition of the invention are not suffocated. The agent is used preferably in an amount of 0 to 30% by weight of the total of the epoxy resins. Examples of a commercially available product of such an epoxy compound include PGE (trade name, manufactured by Nippon Kayaku Co., Ltd.), PP-101 (trade name, manufactured by Tohto Kasei Co., Ltd.), ED-502, ED-509 and ED-509S (trade names, manufactured by Asahi Denka Kogyo K.K.), YED-122 (trade name, manufactured by Yuka-Shell Epoxy Co., Ltd.), KBM-403 (trade name, manufactured by Shin-Etsu Chemical Co., Ltd), and TSL-8350, TSL-8355 and TSL-9905 (trade names, manufactured by Toshiba Silicone Co., Ltd.).

The curing agent is not particularly limited as far as the agent is an agent that is usually used as a curing agent for epoxy resin. Examples thereof include phenol Novolak resins such as H-1 (trade name, manufactured by Meiwa Chemical Industry Co., Ltd.), and VR-9300 (trade name, manufactured by Mitsui Toatsu Chemicals, Inc.); phenol aralkyl resins such as XL-225 (trade name, manufactured by Mitsui Toatsu Chemicals, Inc.); allylated phenol Novolak resins such as AL-VR-9300 (trade name, manufactured by Mitsui Toatsu Chemicals, Inc.); dicyandiamide; a microcapsule-form curing agent made of a reactant from an epoxy resin and an amine compound, such as NOVACURE (trade name, manufactured by Asahi Kasei Corp.); MTPC (trade name, manufactured by Honshu Chemical Industry Co., Ltd.), which is a p-cresol Novolak resin represented by a general formula (II) illustrated below; PP-700-300 (trade name, manufactured by Nippon Petrochemicals Co., Ltd.), which is an especial phenol resin represented by a general formula (III) illustrated below; and ADH, PDH and SDH (trade names, each manufactured by Japan Hydrazine Co., Inc.), which are each a dibasic acid dihydrazide represented by a general formula (IV) illustrated below.

[formula 3]

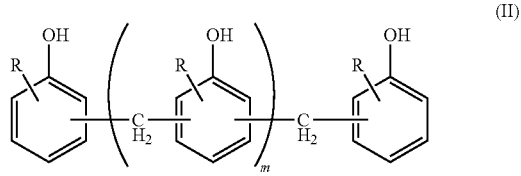

(II)

In the general formula (II), R's each represent a hydrocarbon group, and m represents an integer of 1 to 5.

[formula 4]

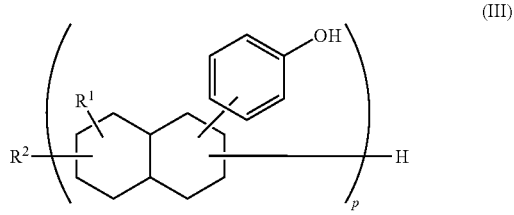

(III)

In the general formula (III), $R^1$ represents an alkyl group, $R^2$ represents hydrogen or a hydrocarbon group, and p is an integer of 2 to 4.

[formula 5]

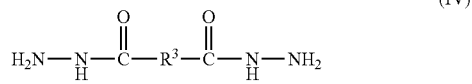

(IV)

In the general formula (IV), $R^3$ represents a bivalent aromatic group such as a m-phenylene group or a p-phenylene group, or a linear or branched alkylene group having 1 to 12 carbon atoms.

These curing agents may be used alone or in an appropriate combination of two or more thereof.

About the use amount of the curing agent, the total amount of reaction active groups in the curing agent is preferably from 0.3 to 1.2 equivalents, more preferably from 0.4 to 1.0 equivalent, in particular preferably from 0.5 to 1.0 equivalent per equivalent of the epoxy groups of the epoxy resin. If the use amount of the curing agent is less than 0.3 equivalent, the reflow cracking resistance tends to decline. If the equivalent is more than 1.2 equivalents, the viscosity of the adhesive composition rises so that the workability tends to decline. The reaction active groups in the curing agent are each a substituent having reaction activity with the epoxy resin, and an example thereof is a phenolic hydroxide group.

The use amount of the curing agent is preferably from 0.01 to 90 parts by weight, more preferably from 0.1 to 50 parts by weight for 100 parts by weight of the epoxy resin. If the use amount of the curing agent is less than 0.01 part by weight, the curability tends to decline. If the amount is more than 90 parts by weight, the viscosity of the adhesive composition increases so that the workability tends to decline.

Examples of the curing promoter include EMZ K, and TPPK (trade names, each manufactured by Hokko Chemical Industry Co., Ltd.), which are each an organic boron salt compound; tertiary amines, or DBU and U-CAT's 102, 106, 830, 840 and 5002 (trade names, each manufactured by San-Apro Ltd.), which are salts thereof; and CUREZOL, 2PZ-CN, 2P4MHZ, C17Z, and 2PZ-OK (trade names, each manufactured by Shikoku Chemicals Corp., which are imidazoles.

About each of the curing agent and the optionally added curing promoter, a single species thereof may be used, or plural species may be used in an appropriate combination. The use amount of the curing promoter is preferably 20 parts or less by weight for 100 parts by weight of the epoxy resin.

The compound having a polymerizable ethylenical carbon-carbon double bond is an acrylate ester compound, a methacrylate ester compound or the like, and is a compound having, in a single molecule thereof, one or more acrylic groups or methacrylic groups. Specific examples thereof include acrylate compounds such as methyl acrylate, ethyl acrylate, propyl acrylate, isopropyl acrylate, n-butyl acrylate, isobutyl acrylate, t-butyl acrylate, amyl acrylate, isoamyl acrylate, hexyl acrylate, heptyl acrylate, octyl acrylate, 2-ethylhexyl acrylate, nonyl acrylate, decyl acrylate, isodecyl acrylate, lauryl acrylate, tridecyl acrylate, hexadecyl acrylate, stearyl acrylate, isostearyl acrylate, cyclohexyl acrylate, and isobornyl acrylate; methacrylate compounds such as methyl methacrylate, ethyl methacrylate, propyl methacrylate, isopropyl methacrylate, n-butyl methacrylate, isobutyl methacrylate, t-butyl methacrylate, amyl methacrylate, isoamyl methacrylate, hexyl methacrylate, heptyl methacrylate, octyl methacrylate, 2-ethylhexyl methacrylate, nonyl methacrylate, decyl methacrylate, isodecyl methacrylate, lauryl methacrylate, tridecyl methacrylate, hexadecyl methacrylate, stearyl methacrylate, isostearyl methacrylate, cyclohexyl methacrylate, and isobornyl methacrylate;

acrylate compounds such as diethylene glycol acrylate, polyethylene glycol acrylate, polypropylene acrylate, 2-methoxyethyl acrylate, 2-ethoxyethyl acrylate, 2-butoxyethyl acrylate, methoxydiethylene glycol acrylate, methoxypolyethylene glycol acrylate, dicyclopentenyloxyethyl acrylate, 2-phenoxyethyl acrylate, phenoxydiethylene glycol acrylate, phenoxypolyethylene glycol acrylate, 2-benzoyloxyethyl acrylate, and 2-hydroxy-3-phenoxypropyl acrylate; methacrylate compounds such as diethylene glycol methacrylate, polyethylene glycol methacrylate, polypropylene methacrylate, 2-methoxyethyl methacrylate, 2-ethoxyethyl methacrylate, 2-butoxyethyl methacrylate, methoxydiethylene glycol methacrylate, methoxypolyethylene glycol methacrylate, dicyclopentenyloxyethyl methacrylate, 2-phenoxyethyl methacrylate, phenoxydiethylene glycol methacrylate, phenoxypolyethylene glycol methacrylate, 2-benzoyloxyethyl methacrylate, and 2-hydroxy-3-phenoxypropyl methacrylate;

acrylate compounds such as benzyl acrylate, 2-cyanoethyl acrylate, γ-acryloxyethyltrimethoxysilane, glycidyl acrylate, tetrahydrofurfuryl acrylate, dimethylaminoethyl acrylate, diethylaminoethyl acrylate, acryloxyethyl phosphate, and acryloxyethylphenyl acid phosphate; methacrylate compounds such as benzyl methacrylate, 2-cyanoethyl methacrylate, γ-methacryloxyethyltrimethoxysilane, glycidyl methacrylate, tetrahydrofurfuryl methacrylate, dimethylaminoethyl methacrylate, diethylaminoethyl methacrylate, methacryloxyethyl phosphate, and methacryloxyethylphenyl acid phosphate;

diacrylate compounds such as ethylene glycol diacrylate, 1,4-butanediol diacrylate, 1,6-hexanediol diacrylate, 1,9-nonanediol diacrylate, 1,3-butanediol diacrylate, and neopentyl glycol diacrylate; dimethacrylate compounds such as ethylene glycol dimethacrylate, 1,4-butanediol dimethacrylate, 1,6-hexanediol dimethacrylate, 1,9-nonanediol dimethacrylate, 1,3-butanediol dimethacrylate, and neopentyl glycol dimethacrylate;

diacrylate compounds such as diethylene glycol diacrylate, triethylene glycol diacrylate, tetraethylene glycol diacrylate, polyethylene glycol diacrylate, tripropylene glycol diacrylate, and polypropylene glycol diacrylate; dimethacrylate compounds such as diethylene glycol dimethacrylate, triethylene glycol dimethacrylate, tetraethylene glycol dimethacrylate, polyethylene glycol dimethacrylate, tripropylene glycol dimethacrylate, and polypropylene glycol dimethacrylate;

a reaction product made from one mole of bisphenol A, bisphenol F or bisphenol AD and two moles of glycidyl acrylate, and a reaction product made from one mole of bisphenol A, bisphenol F or bisphenol AD and two moles of glycidyl methacrylate;

a diacrylate of a polyethylene oxide adduct of bisphenol A, bisphenol F or bisphenol AD, a diacrylate of a polypropylene oxide adduct of bisphenol A, bisphenol F or bisphenol AD, a dimethacrylate of a polyethylene oxide adduct of bisphenol A, bisphenol F or bisphenol AD, a dimethacrylate of a polypropylene oxide adduct of bisphenol F or bisphenol AD; and bis(acryloxypropyl)polydimethylsiloxane, bis(acryloxypropyl)methylsiloxane-dimethylsiloxane copolymer, bis(methacryloxypropyl)polydimethylsiloxane, and bis(methacryloxypropyl)methylsiloxane-dimethylsiloxane copolymer.

About the compound having a polymerizable ethylenical carbon-carbon double bond, the above-mentioned compounds may be used alone or in combination of two or more thereof.

The radical initiator is not particularly limited; a peroxide is preferred from the viewpoint of voids and others. The decomposition temperature of the peroxide is preferably from 70 to 170° C. from the viewpoint of the curability and the viscosity stability of the adhesive composition. Specific examples of the radical initiator include 1,1,3,3-tetramethylbutylperoxy2-ethyl hexanoate, 1,1-bis(t-butylperoxy)cyclohexane, 1,1-bis(t-butylperoxy)cyclodecane, di-t-butyl peroxyisophthalate, t-butyl peroxybenzoate, dicumyl peroxide, t-butylcumyl peroxide, 2,5-dimethyl-2,5-di(t-butylperoxy) hexane, 2,5-dimethyl-2,5-di(t-butylperoxy)3-hexyne, and cumenehydroperoxide. The blend amount of the radical initiator is preferably from 0.1 to 10% by weight in the adhesive composition, more preferably from 0.5 to 5% by weight therein.

Examples of the flexibility agent include liquid polybutadienes ("CTBN-1300×31" and "CTBN-1300×9" manufactured by Ube Industries, Ltd., and "NISSO-PB-C-2000" manufactured by Nippon Soda Co., Ltd.). The flexibility agent has an effect of relieving stress generated by bonding a semiconductor element and a lead frame to each other. The blend amount of the flexibility agent is usually from 0 to 500 parts by weight for 100 parts by weight of the whole of the organic polymeric compound(s) and the precursor(s) thereof.

The aliphatic dihydroxycarboxylic acid (b2) is not particularly limited as far as the compound is a compound wherein two hydroxyl groups and one or more carboxyl groups are bonded directly or through an aliphatic side chain to an aliphatic main chain skeleton. The two hydroxyl groups may be bonded to the same carbon atom or different carbon atoms. The two groups are preferably bonded to the same carbon atom. The aliphatic dihydroxycarboxylic acid (b2) is preferably a dihydroxyalkanoic acid. Examples thereof include 2,2-bishydroxymethylpropionic acid, 2,2-bishydroxymethylbutanoic acid, 2,2-bishydroxymethylpentanoic acid, 2,2-bishydroxymethylhexanoic acid, 2,2-bishydroxymethylheptanoic acid, 2,2-bishydroxymethyloctanoic acid, tartaric acid, dihydroxyadipic acid, and other dihydroxy $C_{3-20}$ alkane monocarboxylic acids and dicarboxylic acids. Preferred examples thereof include dihydroxy $C_{4-14}$ alkane monocarboxylic acids.

The aliphatic dihydroxycarboxylic acid (b2) is preferably an aliphatic dihydroxycarboxylic acid represented by the following general formula (1):

[formula 6]

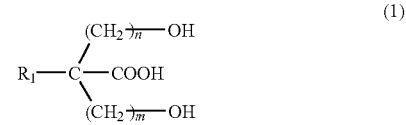

In the formula (1), $R_1$ is an alkyl group which may have a substituent, and n and m are each an integer of 0 to 5.

$R_1$ is, for example, an alkyl group having 1 to 5 carbon atoms, such as a methyl, ethyl, propyl, isopropyl, butyl, isobutyl, tert-butyl or pentyl group.

Specific examples of the aliphatic dihydroxycarboxylic acid represented by the general formula (1) include 2,2-bishydroxymethylpropionic acid, 2,2-bishydroxymethylbutanoic acid, and 2,2-bishydroxymethylpentanoic acid. Of these examples, 2,2-bishydroxymethylpropionic acid is preferred.

In the invention, the content of the aliphatic dihydroxycarboxylic acid (b2) is preferably from 0.1 to 20 parts by weight for 100 parts by weight of the metal (a2) having a melting point lower than the reflow temperature and containing no lead, and is more preferably from 1.0 to 10 parts by weight therefor from the viewpoint of storage stability and electroconductivity. If the content of the aliphatic dihydroxycarboxylic acid (b2) is less than 0.1 part by mass, the meltability of the electroconductive particles (A) declines. Thus, metallic bonds are not sufficiently generated between the metal particles so that the electroconductivity tends to fall. On the other hand, if the content of the aliphatic dihydroxycarboxylic acid (b2) is more than 20 parts by weight, the effect of reinforcement with the thermosetting resin composition is not sufficiently obtained so that the storage stability and the printability of the adhesive composition tend to decline.

An additive may be used in the adhesive composition of the invention, examples of the additive including an adhesive force improvers such as a silane coupling agent (such as "KBM-573" manufactured by Shin-Etsu Chemical Co., Ltd.), and a titanium coupling agent, wettability improvers such as anionic surfactants and fluorine-contained surfactants, and antifoamers such as silicone oil. The additives, such as the adhesive force improves, the wettability improvers and antifoamers, may be used alone or in combination of two or more thereof. The use amount of the whole of the additive(s) is preferably from 0.1 to 10% by weight of the whole of the adhesive composition.

If necessary, a diluting agent may be added to the adhesive composition of the invention in order to make a further improvement in the workability of the adhesive composition when the composition is prepared, and the painting workability better when the composition is used. The diluting agent is preferably an organic solvent having a relatively high boiling point, such as butyl cellosolve, carbitol, butylcellosolve acetate, acetic acid carbitol, dipropylene glycol monomethyl ether, ethylene glycol diethyl ether, or α-terpineol. The use amount of the diluting agent is preferably from 0.1 to 30% by weight of the whole of the adhesive composition.

In order to produce the adhesive composition of the invention, it is advisable that: the electroconductive particles (A) and the binder component (B), together with the optionally added other component(s), are in a lump or separately; and a stirrer, a crusher, a three-roll machine, planetary mixer, and other dispersing/dissolving machines are appropriately combined with each other to heat these components optionally and perform mixing, dissolving, degranulating, kneading, or dispersing, thereby making the components into an even paste form.

The adhesive composition of the invention has an electroconductivity equivalent to that of solder, and has an excellent adhesive force; thus, the composition can widely be used as an alternative to a material for regions where solder is conventionally used. In other words, the composition can be used to bond an electronic component, such as a passive component or an LSI package, to a product obtained by impregnating a film of a plastic such as polyimide resin or epoxy resin, a glass nonwoven cloth, or some other substrate with a plastic such as polyimide resin, epoxy resin or BT resin, or to a substrate made of an ceramic such as alumina.

Figure 2:
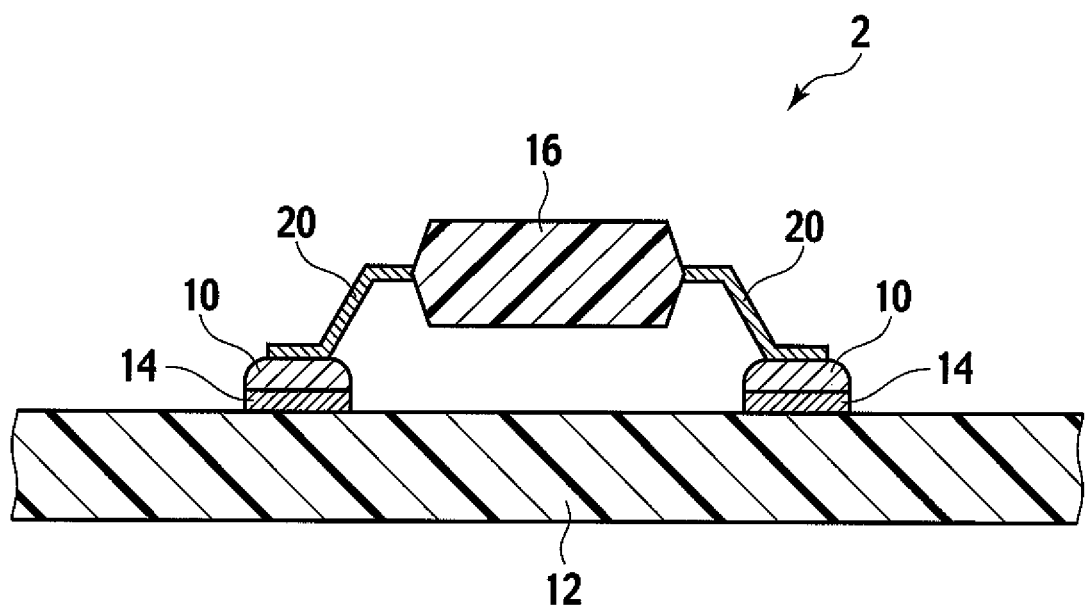
FIG. 2 is a schematic sectional view illustrating another preferred embodiment of the electronic-component-mounted substrate of the invention.

Specifically, as illustrated in FIGS. 1 to 2, the adhesive composition of the invention may be applied also to the connection of a passive component that has been hitherto connected by use of solder, or the connection of an electronic component, such as a semiconductor element, which has been hitherto connected by use of solder or an anisotropic electroconductive film. The adhesive composition of the invention is used suitably, in particular, for a case where a component poor in heat resistance, such as a CCD module, is connected since the adhesive composition makes it possible to attain lower-temperature connection than solder. In a case where a semiconductor element and a substrate are connected to each other through solder, it is necessary to inject an under-fill material between the semiconductor element and the substrate in the prior art in order to relieve stress generated in thermal expansion coefficient between the semiconductor element and the substrate. On the other hand, when the adhesive composition of the invention is used to attain such a connection, no under-fill material is required since the resin component has stress-relieving effect. Additionally, a flux-washing step and an under-fill injecting step can be eliminated; thus, the invention is useful also for a process aspect.

Figure 3:
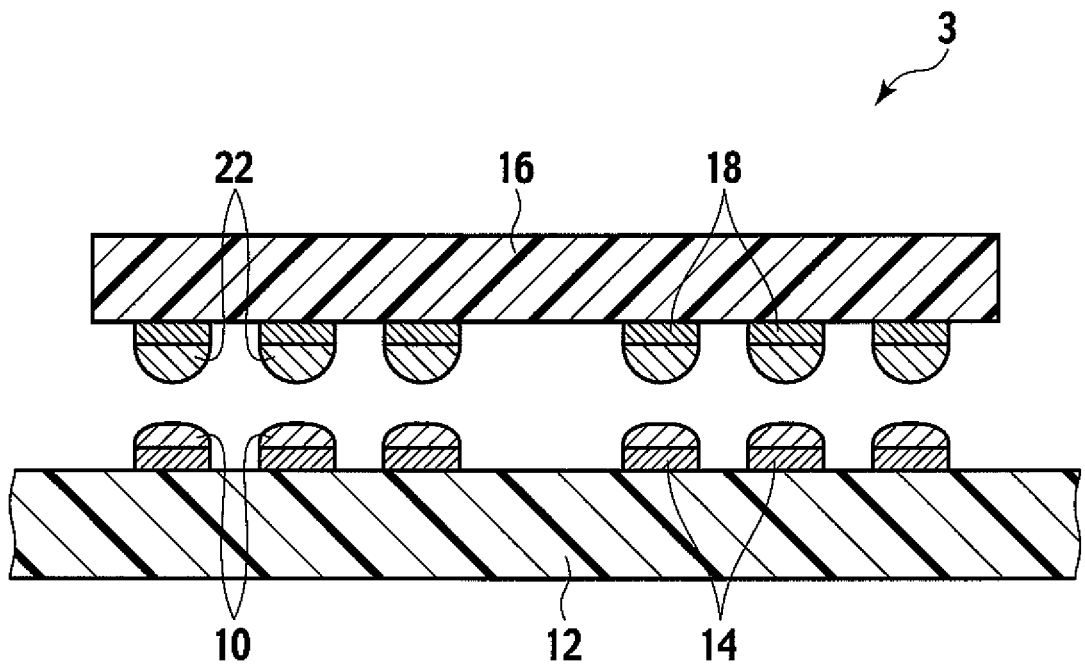
FIG. 3 is a schematic sectional view illustrating still another preferred embodiment of the electronic-component-mounted substrate of the invention.
Figure 4:
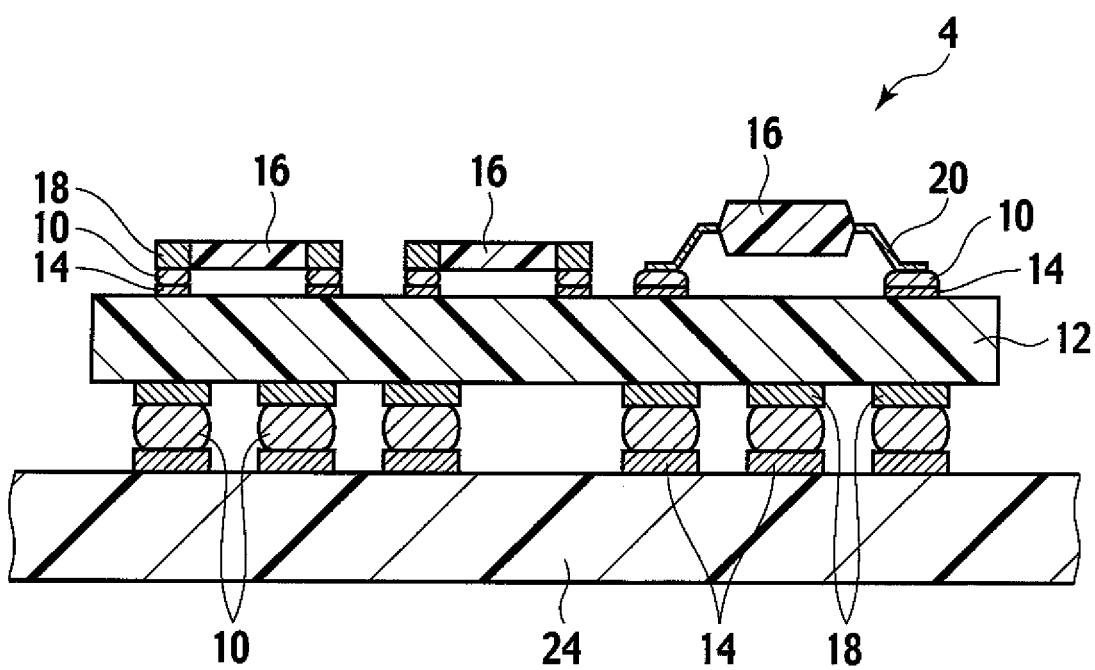
FIG. 4 is a schematic sectional view illustrating a different preferred embodiment of the electronic-component-mounted substrate of the invention.

As illustrated in FIG. 3, the adhesive composition of the invention makes it possible to connect a semiconductor element and a substrate to each other by use of a combination thereof with solder. Furthermore, as illustrated in FIG. 4, the adhesive composition of the invention may be used also when the passive-component-mounted substrate illustrated in FIG. 1 or 2, as an interposer, is mounted on another substrate such as a mother board.

The electronic-component-mounted substrate of the invention has a structure wherein a substrate is bonded to one or more electronic components through the adhesive composition of the invention.

With reference to FIGS. 1 to 4, the electronic-component-mounted substrate of the invention will be described hereinafter.

FIG. 1 is a schematic sectional view illustrating a preferred embodiment of the electronic-component-mounted substrate of the invention. As illustrated in FIG. 1, an electronic-component-mounted substrate 1 has a structure wherein substrate-connecting terminals 14 formed on a substrate 12 are electrically connected to electronic-component-connecting terminals 18 connected to an electronic component 16 through electroconductive members 10. The electroconductive members 10 are each a member obtained by curing the adhesive composition of the invention.

In order to use the adhesive composition of the invention to bond the electronic component 16 to the substrate 12, the adhesive composition is first painted onto the substrate-connecting terminals 14 of the substrate 12 by a dispersing method, a screen printing method, a stamping method or the like. Next, the electronic component 16 having the electronic-component-connecting terminals 18 is pressed and bonded onto the substrate 12 to connect the electronic-component-connecting terminals 18 electrically to the substrate-connecting terminals 14 through the adhesive composition. Thereafter, a heating device, such as an oven or a reflow furnace, is used to heat and cure the adhesive composition. In this way, the bonding can be attained.

The electronic-component-mounted substrate of the invention is not limited to the structure illustrated in FIG. 1, and may have, for example, a structure illustrated in each of FIGS. 2 to 4. An electronic-component-mounted substrate 2 illustrated in FIG. 2 has a structure wherein substrate-connecting terminals 14 formed on a substrate 12 are electrically connected to leads 20 connected to an electronic component 16 through electroconductive members 10 obtained by curing the adhesive composition of the invention.

An electronic-component-mounted substrate 3 illustrated in FIG. 3 has a structure wherein a substrate 12 and an electronic component 16 are connected to each other through a combination of the adhesive composition of the invention with solder. In the electronic-component-mounted substrate 3, electronic-component-connecting terminals 18 are formed on the electronic substrate 16, and further solder balls 22 are formed on the electronic-component-connecting terminals 18. The solder balls 22 are electrically connected to the substrate-connecting terminals 14 formed on the substrate 12 through electroconductive members 10 obtained by curing the adhesive composition of the invention. In this way, the electronic-component-mounted substrate 3 is formed.

Furthermore, an electronic-component-mounted substrate 4 illustrated in FIG. 4 has a structure wherein the substrate 12 illustrated in FIG. 2, on which the electronic component 16 is mounted, is further mounted to another substrate 24. In this case also, the connection between the electronic component 16 and the substrate 12, that between the substrate 12 and the substrate 24 are attained by means of electroconductive members 10 each obtained by curing the adhesive composition of the invention.

The semiconductor device of the invention has a structure wherein a semiconductor element and a semiconductor-element-mounting supporting member are bonded to each other through the adhesive composition of the invention. The semiconductor element is bonded to the semiconductor-element-mounting supporting member and, if necessary, the resultant is caused to undergo a wire bonding step and a sealing step. The semiconductor-element-mounting supporting member may be a lead frame, such as a 42-alloy lead frame, a copper lead frame or a palladium PPF lead frame, a glass epoxy substrate (substrate made of an epoxy resin reinforced with glass fiber), or an organic substrate, such as a BT substrate (a BT-resin-used substrate made from a cyanate monomer, an oligomer thereof, and bismaleimide).

In order to use the adhesive composition of the invention to bond the semiconductor element to the semiconductor-element-mounting supporting member, the adhesive composition is first painted onto the semiconductor-element-mounting supporting member by a dispersing method, a screen printing method, a stamping method or the like, and then the semiconductor element is pressed and bonded to the composition-painted member. Thereafter, a heating device, such as an oven or a heat block, is used to heat the member to cure the composition. In this way, the bonding can be attained. The heating and curing are usually performed by heating at 100 to 300° C. for 5 seconds to 10 hours. Furthermore, the workpiece is caused to undergo a wire bonding step, and then the resultant is sealed in a usual manner, whereby a semiconductor device can be finished.

EXAMPLES

Hereinafter, the invention will be specifically described by way of examples; however, the invention is not limited thereby.

Matters or materials used in Examples and Reference Examples are matters or materials formed or gained by methods described below. About the method for the formation, Example 1 is described as an example. The resin composition and the blend ratio in each of other Examples and Reference Examples are as shown in Tables 1 to 2. The formation method therein is the same as in Example 1.

Example 1

The following were mixed: 14.8 parts by weight of YDF-170 (trade name, a bisphenol F type epoxy resin manufactured by Tohto Kasei Co., Ltd., epoxy equivalent=170), 1.5 parts by weight of 2PZ-CNS (trade name, an imidazole compound manufactured by Shikoku Chemicals Corp.), and 3.7 parts by weight of BHPA (2,2-bishydroxymethylpropionic acid manufactured by Alfa Aesar). The mixture was caused to pass into a three-roll machine three times to prepare a binder component.

Next, to 20 parts by weight of the binder component yielded as described above were added 40 parts by weight of metallic Sn42-Bi58 solder particles (average particle diameter: 20 μm, and melting point: 138° C.), and 40 parts by weight of a metal MA05K (trade name, silver-coated copper powder manufactured by Hitachi Chemical Co., Ltd.), and these components were mixed with each other. A vacuum crusher was used to knead the components under the atmospheric pressure for 10 minutes, and then the components were kneaded at 500 Pa or less for 10 minutes and then subjected to defoaming treatment to yield an adhesive composition.

Examples 2 to 7, and Reference Examples 1 to 7

Each adhesive composition was yielded in the same way as in Example 1 except that each composition shown in Table 1 to 2 was used.

Details of materials shown in Tables 1 to 2 are as described below. The unit of the blend amount of each material in Tables 1 to 2 is part(s) by weight.
BHBA: 2,2-bishydroxymethylbutanoic acid
BHVA: 2,2-bishydroxymethylpentanoic acid
Metallic Sn96.5-Ag3-Cu0.5 solder: average particle diameter=20 μm, and melting point=217° C.
(Evaluations of Adhesive Force, Volume Resistance, TCT Resistance, and High-Temperature Standing Resistance)

Properties of the adhesive composition according to each of Examples 1 to 7 and Reference Examples 1 to 7 were measured by methods described below. The results are together shown in Tables 1 to 2.

(1) Adhesive force: About 0.5 mg of each of the adhesive compositions was painted onto a Ag-plated Cu plate, and a Sn-plated Cu plate, 2 mm×2 mm×0.15 mm, was mounted thereon. Thereafter, a thermal hysteresis of 150° C. for 20 minutes was applied to a test piece using each of the adhesive compositions of Examples 1 to 7 and Reference Examples 1, 2, and 4 to 7. A thermal hysteresis of 260° C. for 10 minutes was applied to a test piece of Reference Example 3. Each of the test pieces was used, and the shear strength thereof was measured at 25° C. by means of a bond tester (DAGE series 4000, manufactured by Arctek Co., Ltd.) under conditions that the shear rate was 500 μm/sec and the clearance was 100 μm.

(2) Volume resistance: Two Ag-plated Cu plates, 1 mm wide×5 mm long×0.15 mm thick, were caused to adhere onto each other into a cross form through each of the adhesive compositions, so as to be made perpendicular to each other, thereby preparing a test piece wherein an adhesive layer had a size of 1 mm×1 mm×0.1 mm. Furthermore, the thermal hysteresis described in the item (1) was applied thereto. The test piece was used, and the volume resistance thereof in the thickness direction was measured by a four-terminal method (R687E, DIGITAL MULTIMETER, manufactured by Advantest Corp.).

(3) TCT test: Each of the adhesive compositions was printed, using a metal mask (thickness: 100 μm, and aperture size: 1.0 mm×1.6 mm), onto a Ag-plated Cu foil land (1.7 mm×1.4 mm) on a glass epoxy substrate (100 mm×50 mm×1.0 mm), and a chip resistor (CHIP RESISTOR RK73Z2BTTD, manufactured by Kowa Co., 3.2 mm×1.6 mm) was mounted thereon. The thermal hysteresis described in the item (1) was applied to this component-mounted substrate to form a test substrate for TCT resistance evaluation. This test substrate was put into a thermal impact testing device (WINTECH NT1010, manufactured by Kusumoto Chemicals Ltd., −55° C./15 min, and 125° C./min), and the connection resistance was measured. Each TCT resistance in Tables 1 to 2 represents the number of the cycle wherein a resistance change ratio of ±10% or more of the initial resistance came to be shown.

(4) High-temperature standing test: A test substrate formed in the same way as in the item (3) was put into a high-temperature tank (small-sized environment test machine JUNIOR SA01, manufactured by Kusumoto Chemicals Ltd.) of 125° C., and the connection resistance was measured. Each high-temperature standing test in Tables 1 to 2 represents the standing time when a resistance change ratio of ±10% or more of the initial resistance came to be shown.

TABLE 1

| | | | \multicolumn{7}{c}{Examples} | | | | | | |
|---|---|---|---|---|---|---|---|---|---|
| | | | 1 | 2 | 3 | 4 | 5 | 6 | 7 |
| Electro-conductive particles (A) | Metal (a1) | MA05K | 40 | 20 | 8 | 17.5 | 22.5 | 20 | 20 |
| | Metal (a2) | Sn42—Bi58 | 40 | 60 | 72 | 52.5 | 67.5 | 60 | 60 |
| | | Sn96.5—Ag3—Cu0.5 | 0 | 0 | 0 | 0 | 0 | 0 | 0 |
| Binder (B) | Thermosetting resin composition (b1) | Epoxy resin | 14.8 | 14.8 | 14.8 | 22.3 | 7.5 | 14.8 | 14.8 |
| | | Curing promoter | 1.5 | 1.5 | 1.5 | 2.2 | 0.7 | 1.5 | 1.5 |
| | Aliphatic dihydroxycarboxylic acid (b2) | BHPA | 3.7 | 3.7 | 3.7 | 5.5 | 1.8 | 0 | 0 |
| | | BHBA | 0 | 0 | 0 | 0 | 0 | 3.7 | 0 |
| | | BHVA | 0 | 0 | 0 | 0 | 0 | 0 | 3.7 |
| | Aromatic carboxylic acid | Salicylic acid | 0 | 0 | 0 | 0 | 0 | 0 | 0 |
| Thermal hysteresis | Curing temperature (° C.) | | 150 | 150 | 150 | 150 | 150 | 150 | 150 |
| | Curing time (minutes) | | 20 | 20 | 20 | 20 | 20 | 20 | 20 |
| Adhesive force (MPa) | | | 57 | 62 | 68 | 60 | 58 | 60 | 63 |
| Volume resistance value ($\times 10^{-5}$ $\Omega \cdot$ cm) | | | 4.1 | 2.3 | 3.6 | 2.7 | 3.7 | 2.4 | 2.3 |
| TCT test (−55 to 125° C.) (the number of the cycle) | | | 2100 | 3700 | 2800 | 3700 | 2500 | 3500 | 3500 |
| High-temperature standing test (at 125° C.) (hours) | | | >2000 | >2000 | >2000 | >2000 | >2000 | >2000 | >2000 |

TABLE 2

| | | | \multicolumn{7}{c}{Reference Examples} | | | | | | |
|---|---|---|---|---|---|---|---|---|---|
| | | | 1 | 2 | 3 | 4 | 5 | 6 | 7 |
| Electro-conductive particles (A) | Metal (a1) | MA05K | 0 | 0 | 0 | 20 | 20 | 0 | 0 |
| | Metal (a2) | Sn42—Bi58 | 80 | 95 | 0 | 60 | 60 | 80 | 80 |
| | | Sn96.5—Ag3—Cu0.5 | 0 | 0 | 95 | 0 | 0 | 0 | 0 |
| Binder (B) | Thermosetting resin composition (b1) | Epoxy resin | 14.8 | 0 | 0 | 14.8 | 18.2 | 14.8 | 14.8 |
| | | Curing promoter | 1.5 | 0 | 0 | 1.5 | 1.8 | 1.5 | 1.5 |
| | Aliphatic dihydroxycarboxylic acid (b2) | BHPA | 3.7 | 5 | 5 | 0 | 0 | 0 | 0 |
| | | BHBA | 0 | 0 | 0 | 0 | 0 | 3.7 | 0 |
| | | BHVA | 0 | 0 | 0 | 0 | 0 | 0 | 3.7 |
| | Aromatic carboxylic acid | Salicylic acid | 0 | 0 | 0 | 3.7 | 0 | 0 | 0 |
| Thermal hysteresis | Curing temperature (° C.) | | 150 | 150 | 260 | 150 | 150 | 150 | 150 |
| | Curing time (minutes) | | 20 | 20 | 10 | 20 | 20 | 20 | 20 |
| Adhesive force (MPa) | | | 67 | 69 | 66 | 22 | 66 | 68 | 65 |
| Volume resistance value ($\times 10^{-5}$ $\Omega \cdot$ cm) | | | 8.2 | 8.0 | 2.4 | >10 | >10 | 8.4 | 8.3 |
| TCT test (−55 to 125° C.) (the number of the cycle) | | | 2000 | 1000 | 800 | 200 | 100 | 2000 | 2000 |
| High-temperature standing test (at 125° C.) (hours) | | | >2000 | >2000 | >2000 | <100 | <100 | >2000 | >2000 |

From Table 1, it is understood that the adhesive compositions of the invention have an excellent TCT resistance. The adhesive composition of Reference Example 1, wherein the metal (a1) is not contained, has a larger volume resistance value and is poorer in the reliabilities according to the TCT test compared to Examples 1 and 2, wherein the metal (a1) is contained.

The adhesive composition of Reference Example 2 or 3, wherein neither the metal (a1) nor the thermosetting resin composition (b1) is contained, is poorer in the reliabilities according to the TCT test compared to Examples 1 and 2, wherein the metal (a1) and the thermosetting resin composition (b1) are contained, since the effect of reinforcement with the thermosetting component is not obtained. The adhesive compositions of Reference Examples 4 and 5, wherein the aliphatic dihydroxycarboxylic acid (b2) is not contained, have a larger volume resistance value and are also poorer in the reliabilities according to the TCT test compared to Examples 1 to 7, wherein the aliphatic dihydroxycarboxylic acid (b2) is contained, since effective paths of metallic bonds are not formed. The adhesive composition of Reference Example 6 or 7, wherein the metal (a1) is not contained, has a larger volume resistance value and is also poorer in the reliabilities according to the TCT test compared to Examples 6 and 7, wherein the metal (a1) is contained.

The invention claimed is:

1. An adhesive composition, comprising electroconductive particles (A) and a binder component (B),
   wherein the electroconductive particles (A) comprise a metal (a1) having a melting point equal to or higher than a reflow temperature and containing no lead, and a metal (a2) having a melting point lower than the reflow temperature and containing no lead, and
   the binder component (B) comprises a thermosetting resin composition (b1) and an aliphatic dihydroxycarboxylic acid (b2),
   wherein the thermosetting resin composition (b1) comprises an epoxy resin, and
   the aliphatic dihydroxycarboxylic acid (b2) is an aliphatic dihydroxycarboxylic acid represented by the following general formula (1):

[formula 1]

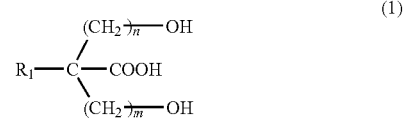

wherein $R_1$ is an alkyl group which may have a substituent, and n and m are each an integer of 0 to 5, and wherein the content of the aliphatic dihydroxycarboxylic acid (b2) is 0.1 part or more by weight and 20 parts or less by weight for 100 parts by weight of the metal (a2) having the melting point lower than the reflow temperature and containing no lead.

2. The adhesive composition according to claim 1, wherein the reflow temperature is a temperature for mounting with SnAgCu cream solder.

3. The adhesive composition according to claim 1, wherein the reflow temperature is 260° C.

4. The adhesive composition according to claim 1, wherein the epoxy resin is an epoxy resin derived from bisphenol F.

5. The adhesive composition according to claim 1, wherein the metal (a1) having the melting point equal to or higher than the reflow temperature and containing no lead is silver-coated copper powder, and the metal (a2) having the melting point lower than the reflow temperature and containing no lead is Sn42-Bi58.

6. An electronic-component-mounted substrate having a structure wherein a substrate and an electronic component are bonded to each other through the adhesive composition as recited in claim 1.

7. A semiconductor device having a structure wherein a semiconductor element and a semiconductor-element-mounting supporting member are bonded to each other through the adhesive composition as recited in claim 1.

8. An electronic-component-mounted substrate having a structure wherein a substrate and an electronic component are bonded to each other through the adhesive composition as recited in claim 2.

9. A semiconductor device having a structure wherein a semiconductor element and a semiconductor-element-mounting supporting member are bonded to each other through the adhesive composition as recited in claim 2.

* * * * *